United States Patent [19]

Beha et al.

[11] Patent Number: 4,845,425

[45] Date of Patent: Jul. 4, 1989

[54] FULL CHIP INTEGRATED CIRCUIT TESTER

[75] Inventors: Johannes G. Beha, Wadenswil, Switzerland; Russell W. Dreyfus, Mt. Kisco, N.Y.; Jeffrey A. Kash, Pleasantville, N.Y.; Gary W. Rubloff, Katonah, N.Y.

[73] Assignee: International Business Machines Corporation, Armonk, N.Y.

[21] Appl. No.: 84,643

[22] Filed: Aug. 11, 1987

Related U.S. Application Data

[62] Division of Ser. No. 778,823, Sep. 23, 1985, Pat. No. 4,703,260.

[51] Int. Cl.$^4$ .................. G01R 31/02; H01L 29/34
[52] U.S. Cl. .................. 324/158 R; 324/73 R; 357/52
[58] Field of Search .............. 324/158 R, 158 D, 71.3, 324/73 R; 357/40, 52

[56] References Cited

U.S. PATENT DOCUMENTS

| | | | |
|---|---|---|---|
| 4,296,372 | 10/1981 | Feuerbaum | 324/71.3 |
| 4,431,967 | 2/1984 | Nishioka | 324/158 R |
| 4,464,627 | 8/1984 | Munakata et al. | 324/158 D |
| 4,609,867 | 9/1986 | Schink | 324/158 R |
| 4,642,565 | 2/1987 | Jastrzebski et al. | 324/158 D |

OTHER PUBLICATIONS

Rubloff, G. W.; "Contactless Measurement ..."; IBM Tech. Dis. Bull.; vol. 25; No. 3A; Aug. 1982; pp. 1171–1172.

Henley, F. J.; "An Automated ..."; IEEE 1984 Int. Test Con.; 1984; pp. 536–542.

Baxter et al.; "A Photemission ...", Rev. Sci. Instrum.; vol. 44; No. 11; Nov. 1973; pp. 1628–1629.

Macari et al.; "Automated Contactless ..."; 1982 IEEE/Proc. IRPS; Mar. 30, 31, 1982; pp. 163–166.

Primary Examiner—Ernest F. Karlsen
Attorney, Agent, or Firm—Philip J. Feig

[57] ABSTRACT

Contactless probing of an integrated circuit is carried out by flooding the surface of the integrated circuit with pulsed ultraviolet laser light, causing photoelectron emission as a function of the potentials at micropoints on the integrated circuit, converting this two-dimensional electron pattern into a corresponding relatively long duration pattern of luminescence by a luminescent target, and reviewing the result by video/computer scanning. Separate embodiments allow testing either in vacuum or in air, with or without insulating passivation layers present on the chip. The result is a contactless oscilloscope which monitors instantaneous voltages (logic states and AC switching waveforms) for a full two-demsnsional array of micropoints simultaneously. A chip with test points and appropriate windows for laser activation and luminescent targeting can be specially designed for optimal testing.

4 Claims, 4 Drawing Sheets

FULL CHIP INTEGRATED CIRCUIT TESTER

This is a division of application Ser. No. 778,823, filed Sept. 23, 1985, now U.S. Pat. No. 4,703,260.

BACKGROUND OF THE INVENTION

1. Field of the Invention

This invention relates to a noncontact dynamic operational monitoring testing of integrated circuits, and more particularly relates to a full chip testing procedure by which instantaneous operational voltages at a number of nodes on an integrated circuit are measured by pulsed laser induced photoemission at specific times during the chip clock cycle.

2. Description of the Prior Art

Known techniques for testing internal nodes of integrated circuits, whether carried out by mechanical contact probing or contactless techniques, suffer from the inherently slow speed of any point-by-point measurement. In addition, most of these do not give as reliable a picture of the circuit operation as would a real-time measurement.

The following are representative of the prior art and scientific background:

Copending U.S. patent application of Beha, Dreyfus and Rubloff, Ser. No. 667,506 filed Nov. 1, 1984, now U.S. Pat. No. 4,706,018, entitled NON-CONTACT DYNAMIC TESTER FOR INTEGRATED CIRCUITS, shows a tester which allows testing in vacuum of the dynamic operation and performance of high-speed very large scale integration (VLSI) circuits, including on-chip contactless measurement of AC switching waveforms (picosecond time scales) as well as logic state evaluation (nanosecond time scales) using high energy photons (about 5-6 eV). This technique is based on the phenomenon of photo-induced elecron emission (photoelectron emission) from a solid surface into vacuum. In this technique, the voltage of a single circuit node is measured as a function of time during the chip clock cycle.

Copending U.S. patent application of Beha, Dreyfus, Hartstein and Rubloff, Ser. No. 717,409, filed Mar. 29, 1985, now U.S. Pat. No. 4,644,264, entitled PHOTON ASSISTED TUNNELING TESTING FOR PASSIVATED INTEGRATED CIRCUITS, show a tester which allows testing in air of the dynamic operation and performance of high-speed very large scale integration (VLSI) circuits. This technique employs a transparent insulating passivation layer, often present over the circuit's internal nodes, together with a metal overlayer on top of the insulating layer in order to detect the monitoring signal, based on the phenomenon of photon-assisted tunneling from a metal into an oxide. The voltage of a single circuit node is measured as a function of time during the chip clock cycle.

Copending U.S. patent application of Beha, Dreyfus and Rubloff, Ser. No. 717,407, filed Mar. 29, 1985, now U.S. Pat. No, 4,670,170, entitled NONCONTACT FULL-LINE DYNAMIC AC TESTER FOR INTEGRATED CIRCUITS, shows a tester which allows testing in vacuum of the dynamic operation and performance of high-speed very large scale integration (VLSI) circuits. By producing a line focus with the incident laser light and employing high-speed electron deflection optics for the photoemitted electrons (as exploited in a streak camera), this technique achieves simultaneous measurement of the voltage of a one-dimensional array of internal nodes on a circuit.

These real-time measurements of internal node voltages on a chip fall short of the high testing speed attainable by simultaneous measurement of a two-dimensional array of circuit nodes, which is the object of the present invention.

U.S. Pat. No. 1,957,249, Dantscher, ELECTRON DISCHARGE APPARATUS, May 1, 1934, merely shows electron discharge from electron beam excitation. Electron beam testing methods are known as means for contactless measurement of internal circuit nodes. However, they carry several important limitations. First, they require surface availability of metal conductor test points and are therefore inadequate for testing of passivated circuits. Second, the electron beam causes damage to passivating layer materials such as oxides and must therefore be carefully directed away from such areas. Third, and most crucial, they do not permit simultaneous measurement of an array of circuit nodes.

In our copending patent applications listed above, we described techniques for testing of the dynamic operation and performance of high-speed VLSI circuits. Besides the measurement of AC switching waveforms (picosecond time scales) as part of the verification of hardware design, it is also important and helpful to be able to check that the logic operation of the chip is functionally correct. The ability to test the logic states and AC switching waveforms at internal nodes on the chip becomes increasingly important with high chip complexity and wafer scale integration. This can be accomplished with the laser test methods of our copending U.S. patent applications Ser. Nos. 667,506, 717,409, and 717,407) with scanning, or with available metal test points at the chip surface, with electron beam methods of by scanning the probe over the chip. Such scanning is time-consuming, making on-line product testing inconvenient, and does not provide a simultaneous test of the circuits on the chip.

The prior art does not teach nor suggest the invention, which permits dynamic real-time testing of a large two-dimensional array of internal circuit node voltages, i.e. "full-chip" testing of logic states and AC switching waveforms, to provide rapid and accurate evaluation of circuit operation.

SUMMARY OF THE INVENTION

The object of the invention is to provide sensitive real-time contactless testing of integrated circuits. Specific embodiments permit such testing in air environment as well as in vacuum environment, and also allow testing with or without insulating passivation layers present above the circuit nodes to be tested.

Another of the invention is to extend such testing of integrated circuits to carry out "full-chip" real-time testing of AC switching waveforms and logic states, i.e. simultaneous testing of a two-dimensional array of internal circuit nodes.

A specific object of the invention is to permit such testing with oxide, insulator, or passivation layers present on top of the metal test points, thus bringing the test environment into operational similarity with eventual use environment.

Another specific object of the invention is to permit such testing in air environment, as well as in vacuum.

A feature of the invention is the biasing of the chip-to-test to provide increased discrimination by providing a threshold for laser-induced photoemission.

Another feature of the invention is the use of parallel optical processing of the two-dimensional array of information representing the voltage states of test points on the chip. The retained image is then evaluated by computer to provide the necessary test results in computer-usable form.

A specific feature of two embodiments of the invention is the use of electron optics system with microchannel plates and phosphor screen, to image a two-dimensional electron beam pattern and convert it into a corresponding two-dimensional optical pattern.

Another specific feature of an embodiment of the invention is the use of fluorescent material in the passivating insulator layer on the chip to convert the two-dimensional electron signal pattern into a corresponding optical signal pattern.

Another specific feature of two embodiments of the invention is the use of a thin metal overlayer on top of a transparent passivating insulating layer on the chip, such that electrons in the test signal can pass through this thin metal overlayer into vacuum for imaging and measurement.

Another feature of an embodiment of the invention is a chip with available test points passivated, equipped with luminescent screen and positioned in windows for easy testing.

An advantage of the invention is that the entire chip may be read simultaneously, during a single pulse of the chip clock, to provide an instantaneous readout of voltage state of all the test points from which test data might be required.

Another advaantage of the invention is that though all test readings are taken at the high speeds necessary for laser induced photoemission and for reading the voltage state of a high performance integrated circuit, readings are retained for evaluation by the computer. Multiple laser scans may thus be carried out in a very short time, followed by a relatively leisurely review of the test results to determine necessary action, such as reject, rework, accept.

Another advantage of the invention is that is achieves high time resolution (5 picosecond or less) and lateral resolution (1 micron or less) and high voltage resolution (of order 1 mV in reasonable measurement times).

The manufacturing advantage of truly full-chip non-destructive testing, with passivation layers present, which allows testing in the same tool used to carry out personalization, significantly extends the economic advantages of in-process testing by providing freer choice of test tim and easier test setup.

The foregoing and other objects, features and advantages of the invention will be apparent from the more particular description of the preferred embodiments of the invention, as illustrated in the accompanying drawings.

DESCRIPTION OF PREFERRED EMBODIMENTS OF THE INVENTION

Figure 1:
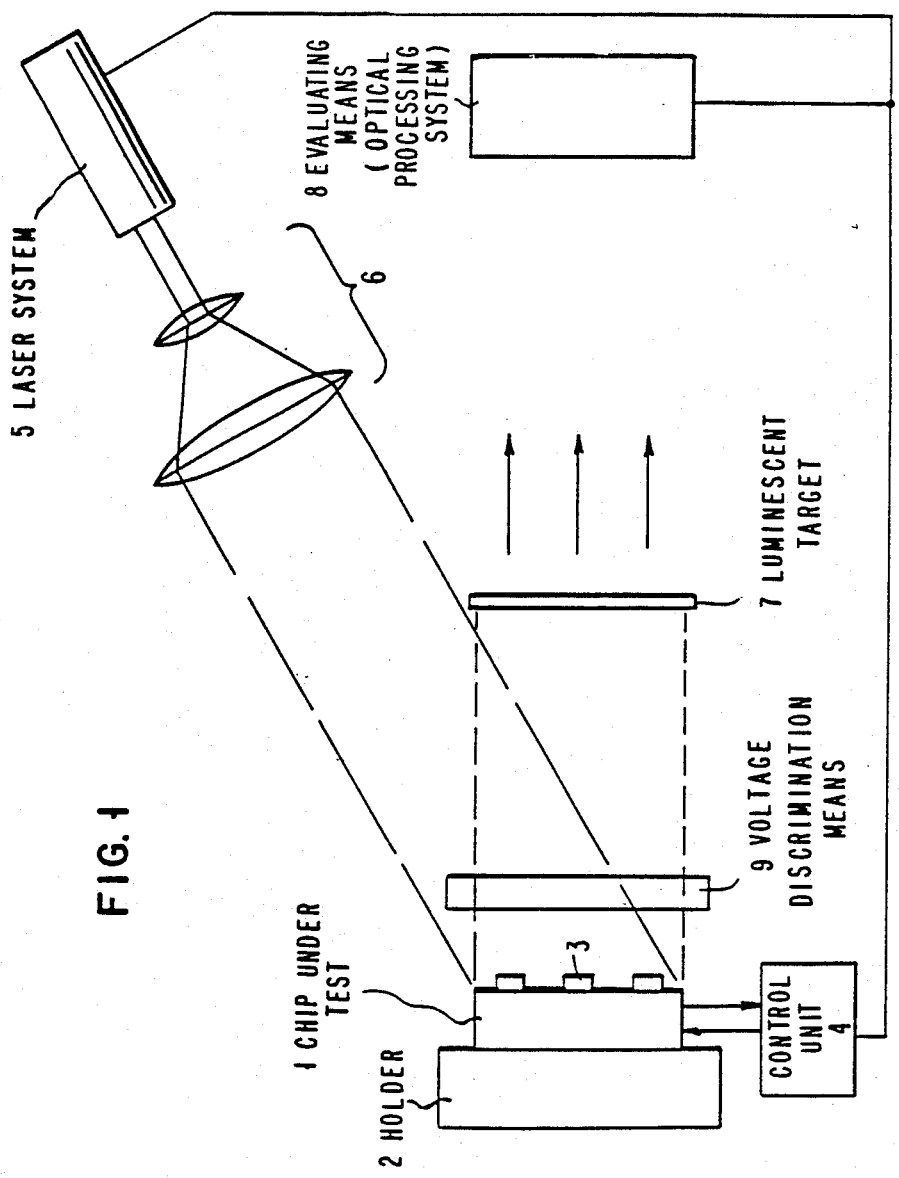
FIG. 1 is a schematic diagram of the invention.

FIG. 1 is a schematic diagram of the invention, showing the impinging pulsed laser beam, the chip under test, and the two-dimensional optical array processor according to the inventive techique.

This technique is a method and apparatus to measure logic states and AC switching waveforms simultaneously in a two-dimensional array across an entire chip, thereby reducing testing time drastically. All voltage levels on the chip are determined at the same time and during the same cycle of the chip clock. This ability to do full-chip testing represents a considerable advance.

The common and salient elements of the full-chip testing method are depicted schematically in FIG. 1. The chip under test 1 is mounted on a substrate or holder 2 so that its various internal nodes or test points 3 are accessible for testing. For high levels of chip integration (typically 10,000–100,000 transistors or circuits per chip) many internal nodes are present which may be the subject of the testing. The operation of the circuitry on the chip is accomplished by driver circuitry in control unit 4, so that the chip runs during the test at full speed as designed.

At a particular instant of time a very fast laser pulse is delivered from the laser system 5 with sufficient photon energy to induce photoelectron emission from the test points 3 on the chip. The laser light is expanded by optical system 6 to illuminate the entire chip, causing photoemission signals from all points which are indicative of the voltages to be determined at that instant of time. Laser system 5 and optical system 6 may be characterized as "activation means." The amount of the photoelectron signal emanating from each test point on the chip is indicative of its voltage during the laser pulse.

The photoelectron patterns are modified and processed by a luminescent target 7, evaluation means 8 and voltage discrimination means 9 to represent test point voltages. These patterns then carry the two-dimensional voltage information, which is translated into a corresponding two-dimensional optical emission pattern from a luminescent (phosphorescent or fluorescent screen) target 7. The pattern is then measured by a parallel optical processing system 8, such as is employed in a vidicon system. Although the response time of the phosphor and video system is not particularly fast, the information corresponds only to the voltage pattern which was present at test points on the chip during the fast laser pulse. With laser pulse widths of 5 picosends or less, time resolution of the full-chip testing system remains extremely fast, consistent with both AC waveform and real-time logic state testing of high performance integrated circuits.

The mechanism by which the photoelectron pattern emanating from the chip is translated into a two-dimensional optical emission pattern from luminescent target 7 can vary considerably, accommodating applications in air or in vacuum, and also with or without passivation layers present on top of the chip test points 3. Three specific embodiments are discussed below.

FIRST EMBODIMENT

TESTING IN VACUUM WITHOUT PASSIVATION LAYERS PRESENT

Figure 2:
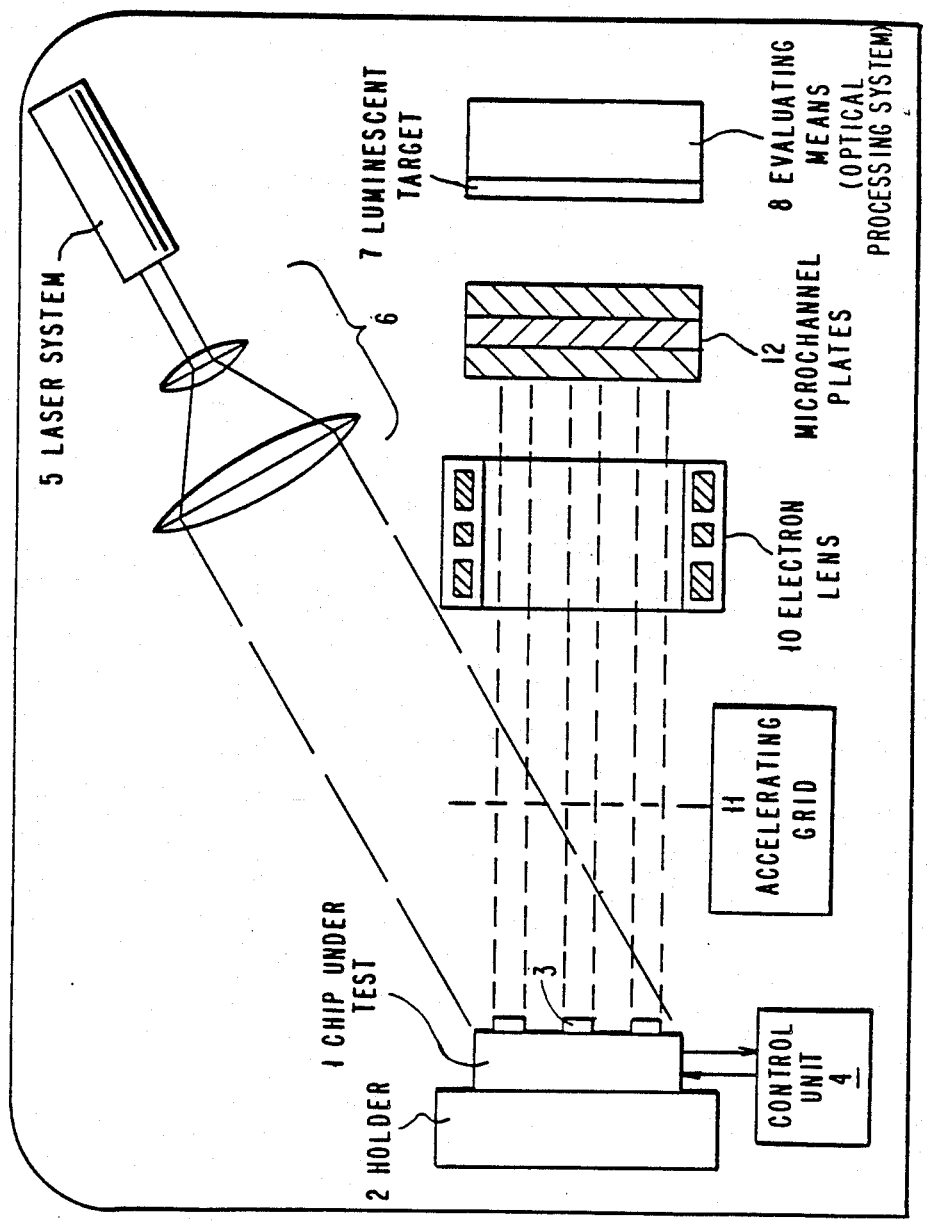
FIG. 2 is a schematic diagram of a first specific embodiment of the invention, directed at testing in vacuum without passivation layers present.

FIG. 2 is a schematic diagram of a first specific embodiment of the invention, directed at testing in vacuum without passivation layers present. An ultraviolet laser beam from laser 5 via optics 6, pulsed synchronously with the chip clock from control unit 4, impinges over the entire chip 1. With laser photon energies L above the work function W of the metal test points 3 on the chip 1, photoelectrons are generated (primary and secondary). These photoelectrons are then imaged onto one or more microchannel plates 12 by an electron lens 10. An accelerating grid 11 in front of hte chip 1 may also be employed to reduce the effects of stray microfields on the chip 1 and to provide voltage discrimination in the signal pattern. The microchannel plates 12 are a high density array of electron multiplier plates which produce high gain in the electron intensity (up to 1,000,000×). These larger electron currents are then accelerated to a luminescent (phosphor) target 7 in optical processing system 8, producing a luminescent representation of test voltages on the chip 1. The iamge brightness at a given test point is a direct function of the voltage at that test point 3 on the chip 1. This luminescent image is then processed by the optical processing system 8, which may be a vidicon or other video device. The image can be retained in the luminescent (phosphor screen) target 7 for much longer times than the laser pulse width.

Since this scheme measures all points on the chip simultaneously, high power laser pulses are required to achieve sufficient signal. This can be attained with commercially available pulsed ultraviolet excimer lasers. Such lasers now have pulse widths in the range 3–20 ns, which is sufficient to resolve voltage levels within a chip clock cycle. A Lumonics TE-861T-4 excimer laser is an example. The characteristics of such a laser are given in Table I for three of the available gases. Using photoyields as estimated in Table 1, assuming the laser beam to be imaged onto a 10 mm.×10 mm. chip, and reducing the peak power density to an acceptable level (10 mJ/cm2), we find that each 1 micron ×1 micron test point could given 35,000–370,000 electrons per laser pulse. This is more than sufficient to make a reasonable voltage measurement for all points on the chip in one laser pulse. Consider the case of KrCl (the worst of the three in Table I) as an example. Assuming the same energy distribution of photoelectrons (1 eV width), a 10 mV change in voltage could be measured with a signal/noise ratio of 2 in a single laser pulse for all 1 micron points on the chip.

TABLE I

Characteristics of some pulsed uv excimer lasers (i.e, Lumonics TE-861T-4) and expected testing photocurrents from Au metal pad/interconnect test points.
Photoyield: calculated from yield above threshold from Au data of W. F. Krolikowski and W. E. Spicer, Phys. Rev. B 1, 478 (1970)

| Laser Gas | ArF | F2 | KrCl |
|---|---|---|---|
| Wavelength (nm) | 193. | 157. | 222. |
| Photon energy (eV) | 6.42 | 7.90 | 5.59 |
| Min pulse width (ns) | 10. | 6. | 6. |
| Max pulse energy (mJ) | 140. | 12. | 25. |
| Max pulse rate (picoseconds) | 200. | 200. | 200. |
| Photon flux during pulse (photons/sec) | 1.3 E + 25 | 1.5 E + 24 | 4.0 E + 24 |
| Estimated photoyield at laser wavelength (electrons/absorbed photon) | 6.0 E − 04 | 3.0 E − 03 | 2.0 E − 04 |
| Electron flux during pulse (electrons/sec) | 8.0 E + 21 | 4.5 E + 21 | 8.8 E + 20 |
| No. electrons per pulse | 8.0 E + 13 | 4.5 E + 13 | 8.8 E + 12 |
| No. electrons/pulse at each test pt (assuming 1 sq. micron ea, 10 mm. × 10 mm. chip and laser beam size) | 8.0 E + 05 | 4.5 E + 05 | 8.8 E + 04 |
| No. electrons/pulse at each test pt for peak power density reduced to 10 mJ/cm2 | 5.7 E + 04 | 3.7 E + 05 | 3.5 E + 04 |

SECOND EMBODIMENT

TESTING IN VACUUM WITH PASSIVATION LAYERS PRESENT

Figure 3:
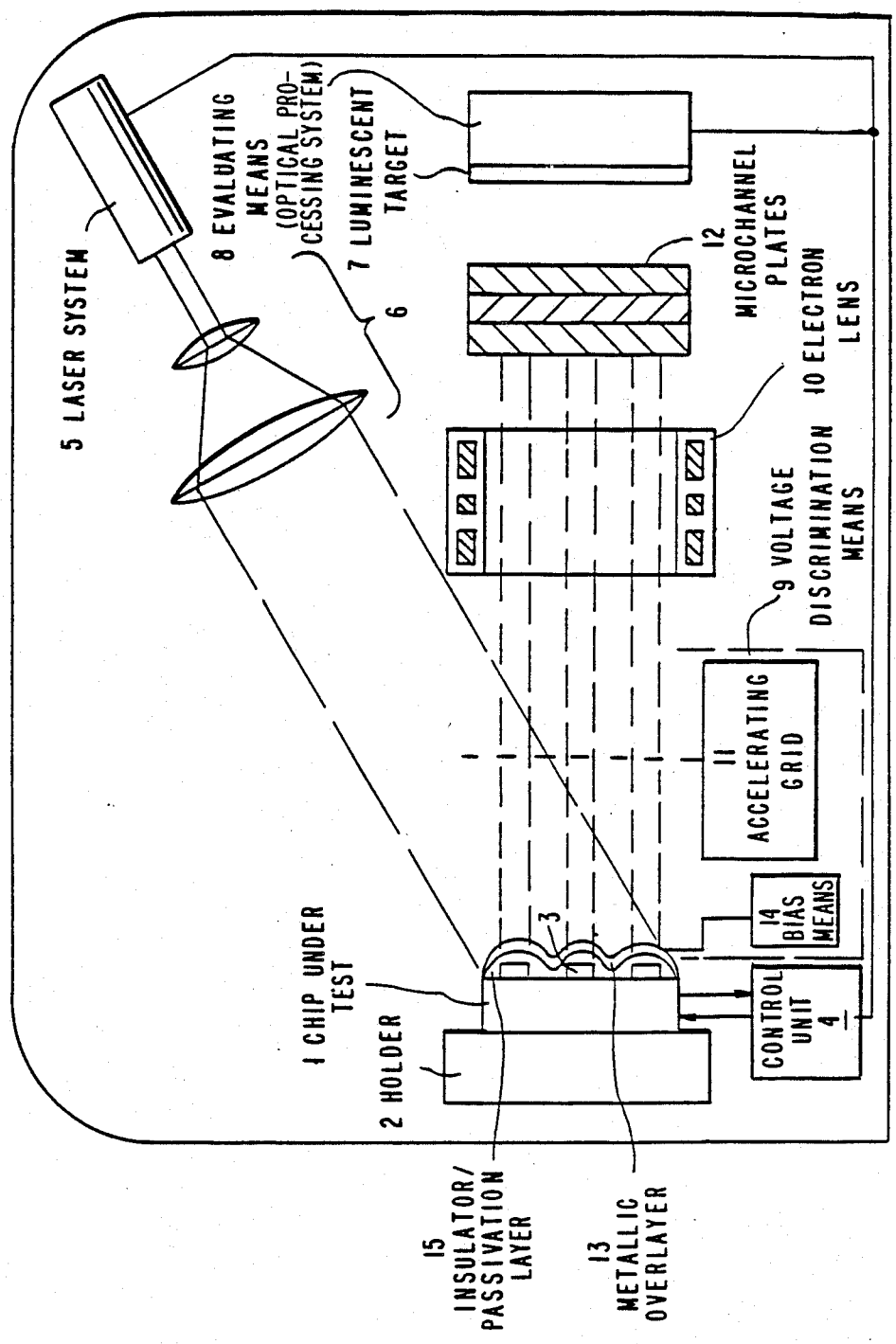
FIG. 3 is a schematic diagram of a second specific embodiment of the invention, directed at testing in vacuum with passivation layers present.

FIG. 3 is a schematic diagram of a second specific embodiment of the invention, directed at testing in vacuum with passivation layers present. The presence of the passivation layers causes three fundamental changes from the first embodiment. First, the threshold energy which the laser light must overcome is reduced by the presence of the passivation layers. Second, the photoelectron energy discrimination is accomplished differently, by the use of photo-assisted tunneling, rather than by electrostatic grids and electron optics in vacuum. Third, electrons having passed the energy analysis stage (photon-assisted tunneling into the insulator or passivation layer) must be emitted into vacuum. This is accomplished by making the metal overlayer very thin.

The apparatus for this second embodiment in FIG. 3 is very similar to that in the first embodiment (FIG. 2) and for common elements is numbered the same. Elements added are metallic overlayer 13, bias means 14 and passivation layer 15 which together with accelerating grid 11 form voltage discriminating means 9 as shown by the dashed bracket and as shown more schematically in FIG. 1. In this case, however, the photon energy from the laser 5 is lower so as to accomplish photon-assisted tunneling of electrons from the metal test points 3 into the coonduction band of the insulator/passivation layer 15 present on the chip 1. It is also a condition, easily achieved, that the passivation layer 15 be transparent to the laser light.

The photoelectrons are collected at a very thin (few hundred angstroms of less) metallic overlayer 13 which is deposited onto the passivation layer, such that laser light can also pass through this metal overlayer. With a voltage applied to the metal overlayer 13 by voltage supply 14, proper electrostatic fields are generated across the passivation layer. A fraction of the electrons reaching the metal overlayer 13 will pass through the metal into the vacuum, since the metal overlayer 13 is thin. These electrons are then accelerated and imaged onto microchannel plates 9 as before (if increased gain is necessary) and thence onto the luminescent target 7 to produce a two-dimensional optical image which can be processed to attain the desired test information. In this embodiment, the function of the electron optics is acceleration and reimaging, but not voltage discrimination as in the first embodiment.

THIRD EMBODIMENT
TESTING IN AIR WITH PASSIVATION LAYERS PRESENT

Figure 4:
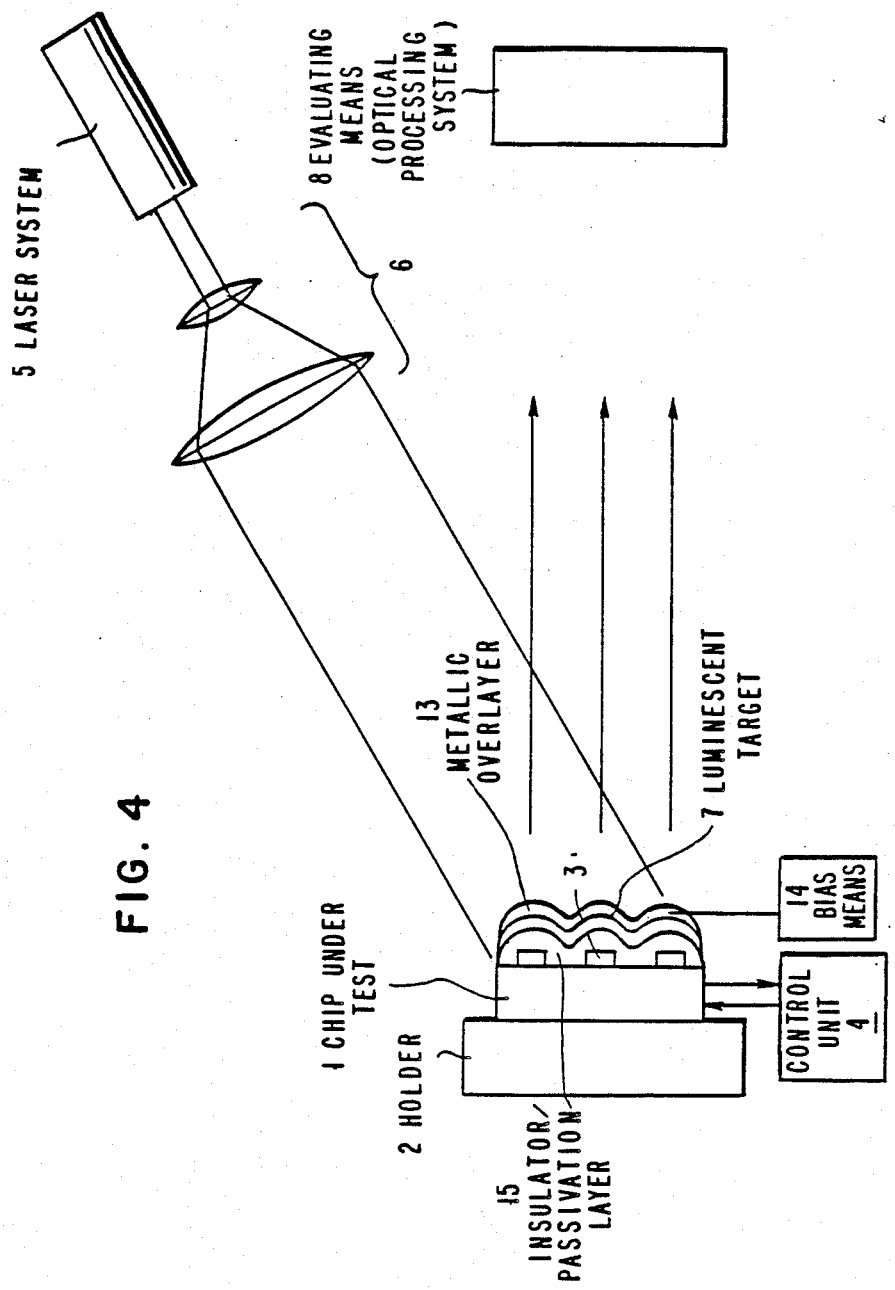
FIG. 4 is a schematic diagram of a third specific embodiment of the invention, directed at testing in air with passivation layers present.

FIG. 4 is a schematic diagram of a third embodiment of the invention, directed at testing in air with passivation layers present. As in the second embodiment, the voltage discrimination is accomplished by photon-assisted tunneling from the chip test points 3 into the conduction band of the insulator/passivation layer 15. However, in this case the photoelectron signal is converted to an optical signal by interaction of the electrons with a luminescent target layer 7 between the insulator 15 and the metal overlayer 13 in windows on the chip 1; this luminescent target layer 7 contains electroluminescent or phosphorescent material. Voltage contrast between different points allows the photoelectron-excited luminescence of luminescent target 7 to be differentiated from the uniform luminescence likely to be excited by the impinging laser pulse inself. In this third embodiment, no further processing is required other than the reading of the two-dimensional luminescence pattern of luminescent target 7 with a vidicon-type processing system 8. The entire test can be accomplished in air ambient.

Note that the luminescent means (7) can be placed directly over the passivation layer (15) as shown in FIG. 4, or may be placed outboard of the electron lens (10), microchannel plates (12), and voltage discrimination means (9), as well as other items as shown in FIG. 3. Direct placement or remote placement of the luminescent means (7) with respect to chip (1) are each acceptable, depending upon the embodiment, so long as the photoemissed electron path is available. That is, chip (1) and luminescent means (7) must be in operatively associated relationship.

Thus, while the invention has been described with reference to three preferred embodiments and other variations, it will be understood by those skilled in the art that the foregoing and other changes in form and details may be made without departing from the scope of the invention.

What is claimed is:

1. An integrated circuit chip-to-test having enhanced susceptibility to testing by non-contact dynamic photon assisted tunneling testing having a multiplicity of operational circuits of which a testable plurality of such circuits are disposed on a surface comprising:
    a plurality of test points at identifiable locations on the chip-to-test accessible by photons;
    a passivation layer covering said plurality of test points and being transparent to laser energy;
    a luminescent target layer covering said plurality of test points and said passivation layer, and
    a transparent conductive overlayer disposed over said test points, said passivation layer and said target layer and being transparent to laser energy,
    wherein said passivation layer and said overlayer are selected such that when the chip-to-test is mounted to operate in a test operational mode and said test points are laser activated during operation, photon assisted tunneling values related to operational parameters are measured from said target layer through said conductive overlayer.

2. An integrated circuit chip-to-test according to claim 1 further comprising
    at least one input-output contact designated for test connection; and
    connection means connecting said test connection to said transparent conductive overlayer (13).

3. An integrated circuit chip-to-test according to claim 1 wherein
    said plurality of test points (3) are located in one or more test areas, and
    optical window openings making available each of said areas to laser light.

4. An integrated circuit chip-to-test according to claim 1
    further comprising luminescent target means (7) disposed between said passivation layer and said overlayer, whereby photoelectron emission from said test points (3) are convertible to relatively long duration luminescence values by said luminescent target means (7) for processing to determine test results.

* * * * *